United States Patent [19]
Akram

[11] Patent Number: 5,661,334
[45] Date of Patent: Aug. 26, 1997

[54] INTER-METAL DIELECTRIC STRUCTURE WHICH COMBINES FLUORINE-DOPED GLASS AND BARRIER LAYERS

[75] Inventor: Salman Akram, Boise, Id.

[73] Assignee: Micron Technology, Inc., Boise, Id.

[21] Appl. No.: 587,361

[22] Filed: Jan. 16, 1996

[51] Int. Cl.$^6$ .................................................. H01L 23/58
[52] U.S. Cl. ........................ 257/632; 257/646; 257/760
[58] Field of Search ............................. 257/632, 746, 257/760

[56] References Cited

U.S. PATENT DOCUMENTS 5,407,529  4/1995  Homma .
5,521,424  5/1996  Ueno et al. .

*Primary Examiner*—Mahshid D. Saadat
*Assistant Examiner*—S. V. Clark
*Attorney, Agent, or Firm*—Angus C. Fox, III

[57] ABSTRACT

An improved inter-metal dielectric structure having a low dielectric constant for reduced capacitive coupling between adjacent metal conductor strips is disclosed. The structure employs silicate glass that is heavily doped with fluorine atoms as the primary dielectric material. The primary dielectric material is encased in an insulative barrier film which has a high degree of impermeability to both fluorine atoms and water molecules. Although the preferred barrier material, silicon nitride, possesses a dielectric constant that is higher than undoped silicate glass, the thickness of the silicon nitride film is relatively insignificant compared to the thickness of the fluorine-doped silicate glass portion of the structure. As the dielectric layers are in a serial relationship with one another and the thickness of the silicon nitride layer is relatively insignificant compared with that of the fluorine-doped glass layer, the dielectric constant of the fluorine-doped glass layer dominates in the composite dielectric constant. The reduced capacitive coupling provides improved circuit performance. Degradation of circuit reliability is prevented by encapsulating the fluorine-doped glass portions of the structure.

34 Claims, 5 Drawing Sheets

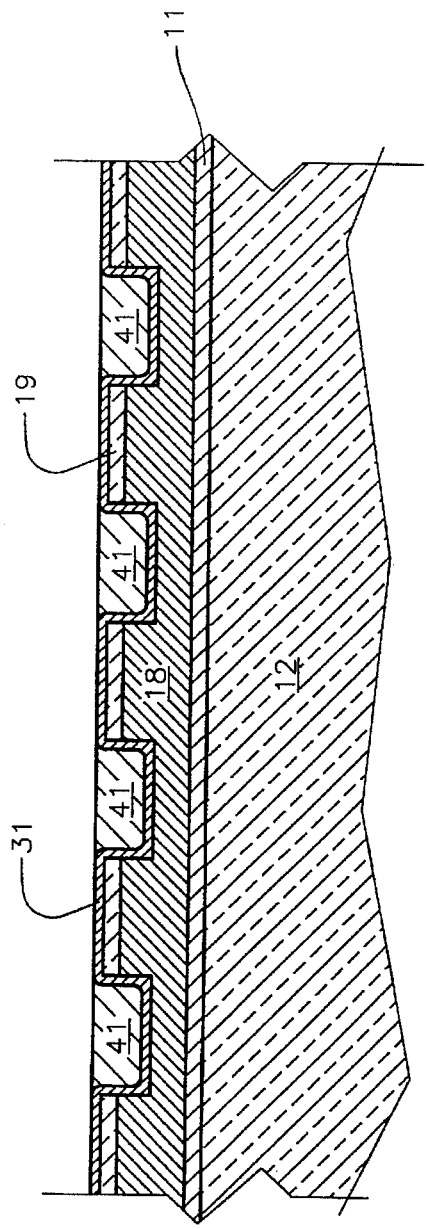
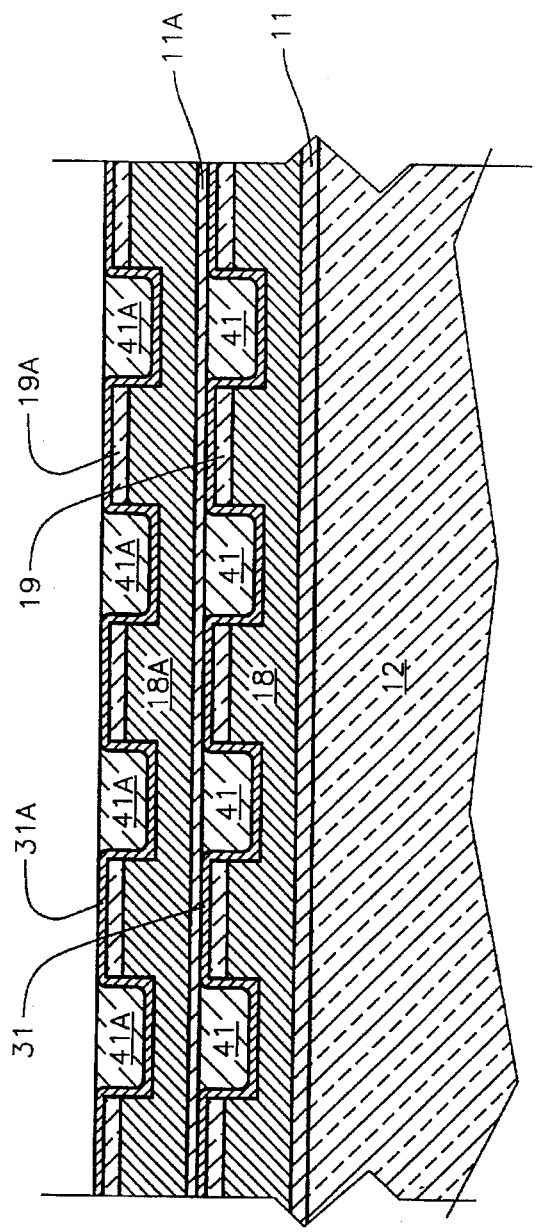
Fig. 4
Fig. 5

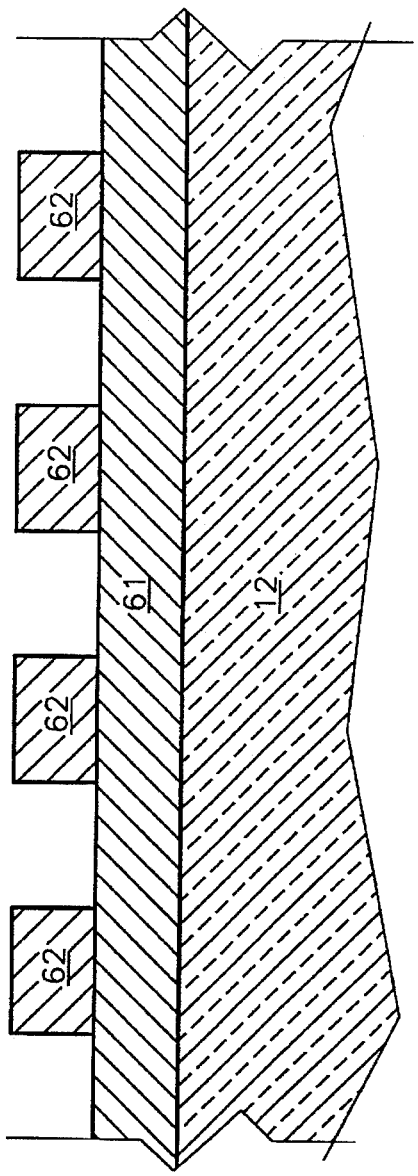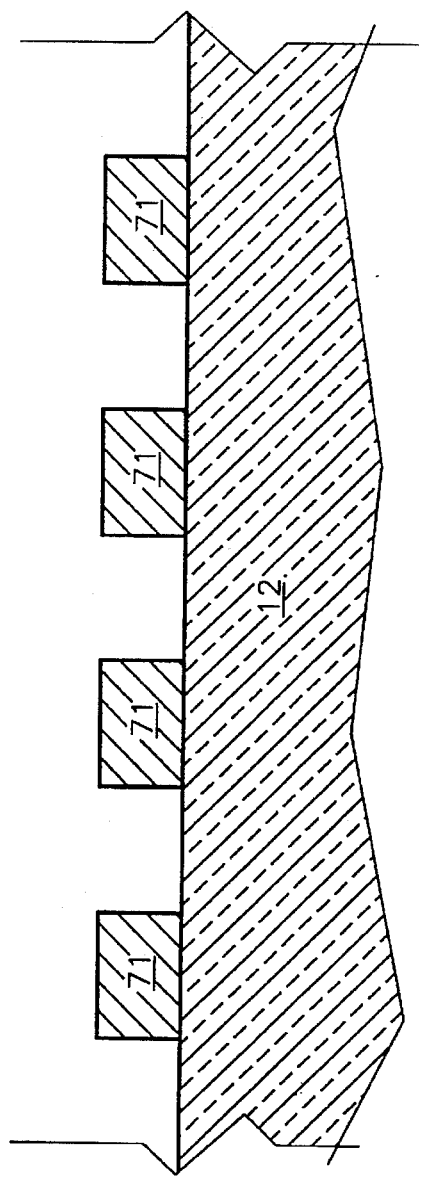

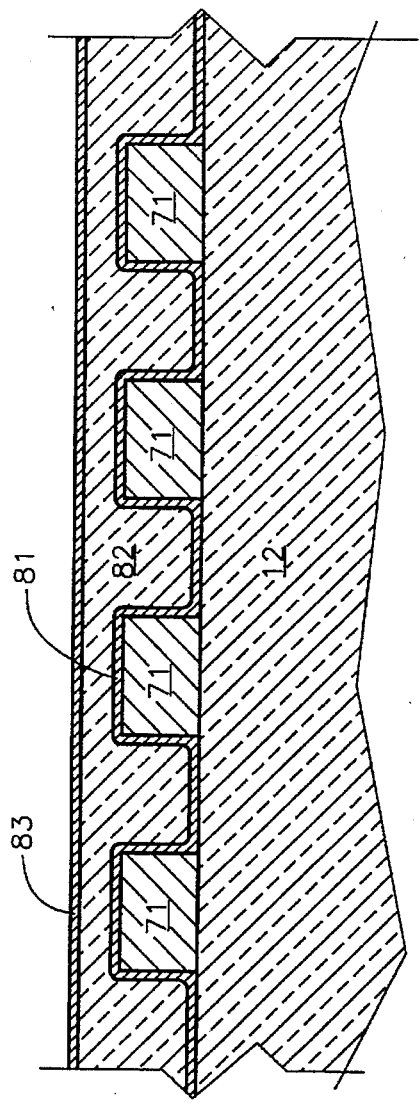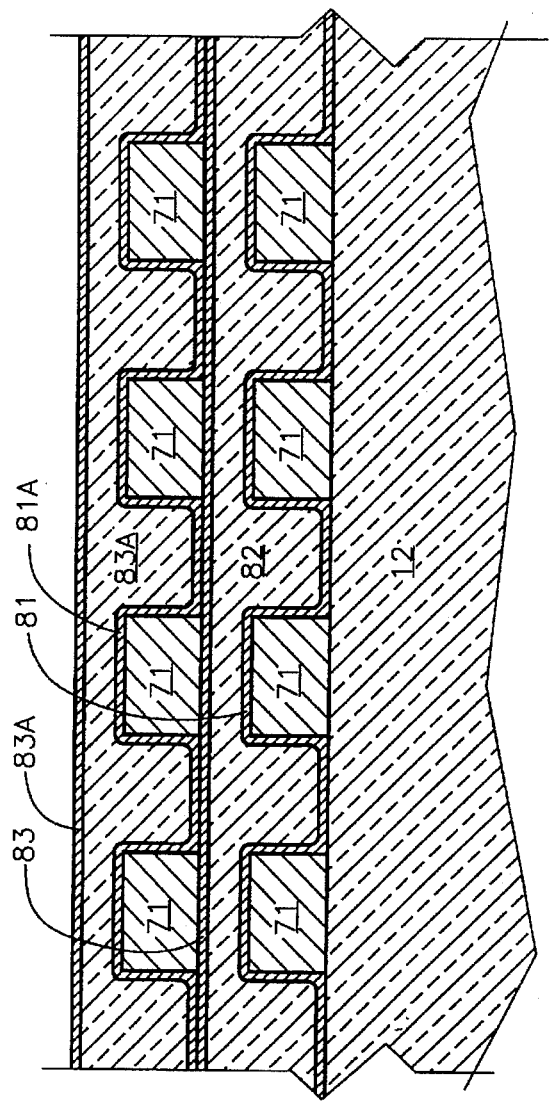

5,661,334

INTER-METAL DIELECTRIC STRUCTURE WHICH COMBINES FLUORINE-DOPED GLASS AND BARRIER LAYERS

FIELD OF THE INVENTION

This invention relates to integrated circuit manufacture and, more particularly, to inter-metal dielectric structures, fluorine-doped glass, and barrier layers.

BACKGROUND OF THE INVENTION

Doped and undoped silicon dioxides, which are commonly referred to as silicate glasses, are widely used as dielectrics in integrated circuits. Although silicon dioxide possesses a tetrahedral matrix which will impart a crystalline structure to the material under proper heating and cooling conditions, the silicon dioxides used as dielectrics in integrated circuits are typically amorphous materials. Chemical vapor deposition of silicate glasses has become of paramount importance in the manufacture of contemporary integrated circuits. For example, silicate glass doped with both boron and phosphorous is widely used as an inter-level dielectric and as a getter material for mobile sodium ions. As geometries are shrunk in the interest of faster operating speeds and lower manufacturing costs, capacitive coupling between narrowly-spaced conductive layers and structures within the circuits has become a significant performance-limiting problem. The increased capacitive coupling leads to RC delays and concomitant speed degradation in integrated circuits.

In order to reduce capacitive coupling within integrated circuitry, glasses having lower dielectric constants have been tried. Fluorine-doped glass is particularly interesting because the incorporation of fluorine into the tetrahedral silicon dioxide matrix significantly lowers the dielectric constant of the material. Fluorine-doped glass may be deposited by the plasma reaction of ethyl hexafluoride ($C_2F_6$), methyl tetrafluoride ($CF_4$), or nearly any fluorine-containing compound with tetraethylorthosilicate and diatomic oxygen gas ($O_2$). Films deposited via this technique have proven to be unusable because they characteristically contain free fluorine atoms. Furthermore, moisture absorption by silicate glasses increases with increasing fluorine doping concentrations. Free fluorine atoms combine with the absorbed moisture to form hydrofluoric acid which gradually leaches out of the glass. As hydrofluoric acid rapidly attacks most metals, with aluminum being particularly vulnerable to attack, circuit degradation is assured. Over time, circuit unreliability, device degradation and/or failure can result.

It is a principal object of the present invention to provide an inter-metal dielectric structure having a low dielectric constant for reduced capacitive coupling between adjacent conductors which does not compromise the reliability of such structures.

SUMMARY OF THE INVENTION

This invention embodies an improved inter-metal dielectric structure having a low dielectric constant for reduced capacitive coupling between adjacent metal conductor strips. The structure employs silicate glass that is heavily doped with fluorine atoms as the primary dielectric material. The primary dielectric material is either encased or partially encased in a silicon nitride film which has a high degree of impermeability to both fluorine atoms and water molecules. Although silicon nitride possesses a dielectric constant that is higher than undoped silicate glass, the thickness of the silicon nitride film is relatively insignificant compared to the thickness of the fluorine-doped silicate glass portion of the structure. As the dielectric layers are in a serial relationship with one another and the thickness of the silicon nitride layer is relatively insignificant compared with that of the fluorine-doped glass layer, the dielectric constant of the fluorine-doped glass layer dominates the composite dielectric constant.

A first embodiment of the invention is fabricated by depositing an optional lower barrier film on top of an underlying interlevel dielectric layer which is composed of a material such as borophosphosilicate glass. Although silicon nitride is deemed to be the preferred material for the lower barrier film, other materials which are impermeable to fluorine atoms and which are compatible with other integrated circuit materials may be substituted for silicon nitride. A fluorine-doped silicate glass layer is then deposited on top of the lower barrier film. An optional silicon dioxide capping layer is deposited on top of the silicate glass layer. Grooves are then etched through the capping layer and into the fluorine-doped glass layer, preferably down to the upper surface of the interlevel dielectric layer. A conformal upper barrier film is then deposited, the upper barrier film completely lining the grooves and covering all exposed surfaces of the optional capping layer and the fluorine-doped glass layer. Silicon nitride is again deemed to be the preferred material for the upper barrier film. An aluminum layer is then deposited such that the nitride lined grooves are completely filled with aluminum metal. Aluminum metal that is not within the physical confines of the grooves is then removed to form aluminum conductor strips. The optional lower barrier film prevents fluorine atoms from diffusing from the fluorine-doped layer into the underlying interlevel dielectric layer, which would certainly increase the dielectric constant of the former and may create reliability problems for underlying structures.

A second embodiment of the invention is fabricated by depositing an aluminum metal layer superjacent an inter-level dielectric layer. The aluminum layer is masked and then etched to form conductor strips on the surface of the interlevel dielectric layer. A conformal silicon nitride barrier film is then deposited such that the conductor strips and the exposed surfaces of the interlevel dielectric layer between the conductor strips are completely covered. A fluorine-doped silicate glass layer is deposited so that it completely fills the gaps between the barrier film wrapped conductor strips. A final silicon nitride capping layer is then deposited to prevent fluorine atoms from escaping from the glass layer.

BRIEF DESCRIPTION OF THE DRAWINGS

FIG. 4 is a cross-sectional view of the wafer portion of FIG. 3 following deposition of a conductive layer and planarization of the conductive layer;

FIG. 5 is a cross-sectional view of the wafer portion of FIG. 4 upon which has been fabricated an additional conductor layer structure to form a hi-level metal structure incorporating the first embodiment of the invention;

FIG. 6 is a cross-sectional view of a portion of an interlevel dielectric layer upon which a conductive layer has been deposited and masked with photoresist in a conductor strip pattern;

FIG. 7 is a cross-sectional view of the wafer portion of FIG. 6 following a predominantly anisotropic etch which forms the conductor strips;

FIG. 8 is a cross-sectional view of the wafer portion of FIG. 7 following the subsequent depositions of a lower barrier film, a fluorine-doped glass layer and a conformal upper barrier film; and FIG. 9 is a cross-sectional view of the wafer portion of FIG. 8, upon which has been fabricated an additional conductor layer structure to form a bi-level metal structure incorporating the second embodiment of the invention.

DETAILED DESCRIPTION OF THE PREFERRED EMBODIMENT

An improved inter-metal dielectric structure having a low dielectric constant for reduced capacitive coupling between adjacent metal conductors may be fabricated by at least two different process sequences.

Figure 1:
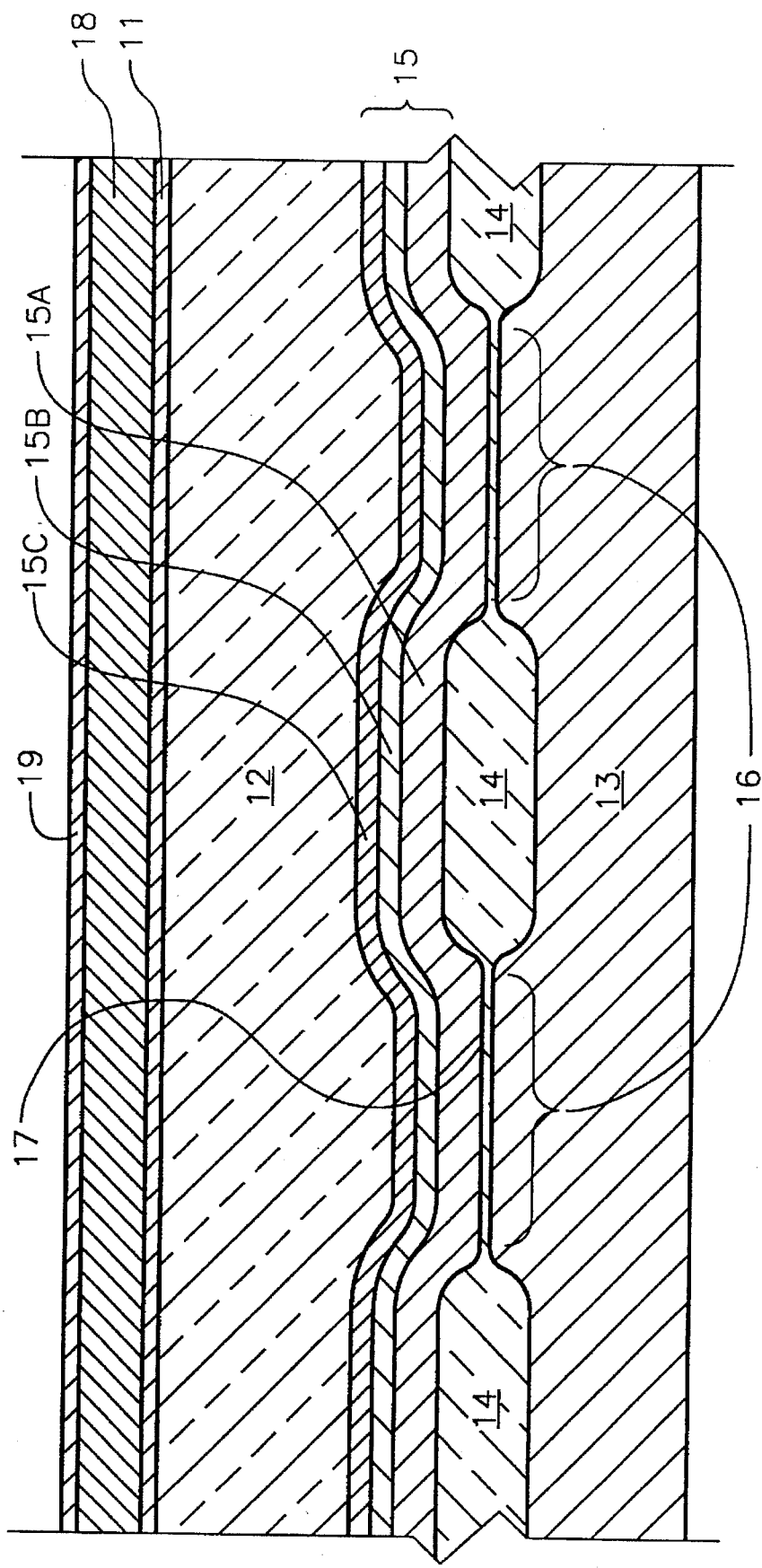
FIG. 1 is a cross-sectional view of a portion of a semiconductor wafer upon which have been deposited sequentially thereon an interlevel dielectric layer, an optional lower barrier film, a fluorine-doped silicate glass layer, an optional silicon dioxide capping layer, and a photoresist mask.

A first embodiment of the process used to fabricate the structure which exemplifies the first embodiment invention is described with reference to FIGS. 1 to 4. Referring to FIG. 1, an optional lower barrier film 11 is deposited on top of an underlying interlevel dielectric layer 12 which comprises a material such as borophosphosilicate glass. Although silicon nitride is deemed to be the preferred material for the lower barrier film 11, other materials such as aluminum nitride which are both impermeable to migrating fluorine ions and compatible with the other materials utilized in integrated circuits may be substituted for silicon nitride. The interlevel dielectric layer 12 overlies a silicon substrate 13 on which a field oxide pattern 14 has been thermally grown. A word line 15 traverses the field oxide pattern 14 and substrate active areas 16 in an undulating pattern. The word line 15 is insulated from the active areas 16 by a gate oxide layer 17. In accordance with contemporary integrated circuit design, the word line 15 comprises a doped polycrystalline silicon layer 15A, a metal (preferably tungsten) silicide layer 15B, and an insulative capping layer 15C (normally either silicon nitride or silicon dioxide). The underlying structures may constitute a complete memory cell array or any other combination of integrated circuit devices. As the present invention may be used with many types of integrated circuits, the nature of the structures underlying the interlevel dielectric layer 12 is not particularly significant. As no further discussion will be devoted to the underlying circuitry, it has been eliminated from the remainder of the drawings. All embodiments of the process begin on top of interlevel dielectric layer 12, a portion of which is depicted in each drawing. Fluorine-doped silicate glass layer 18 is deposited on top of the interlevel dielectric layer 12 or on top of the optional lower barrier film 11. The optional lower barrier film 11 prevents fluorine atoms from diffusing from the fluorine-doped layer into the underlying interlevel dielectric layer, which would increase the dielectric constant of the former. It may also reduce reliability and degrade performance of underlying devices fabricated on the silicon substrate 13. An optional capping layer 19 is deposited on top of the fluorine-doped silicate glass layer 18. The capping layer, which may be silicon nitride or silicon dioxide, 19 prevents the out-diffusion of fluorine atoms from the fluorine-doped silicate glass layer 18 into the ambiance.

Figure 2:
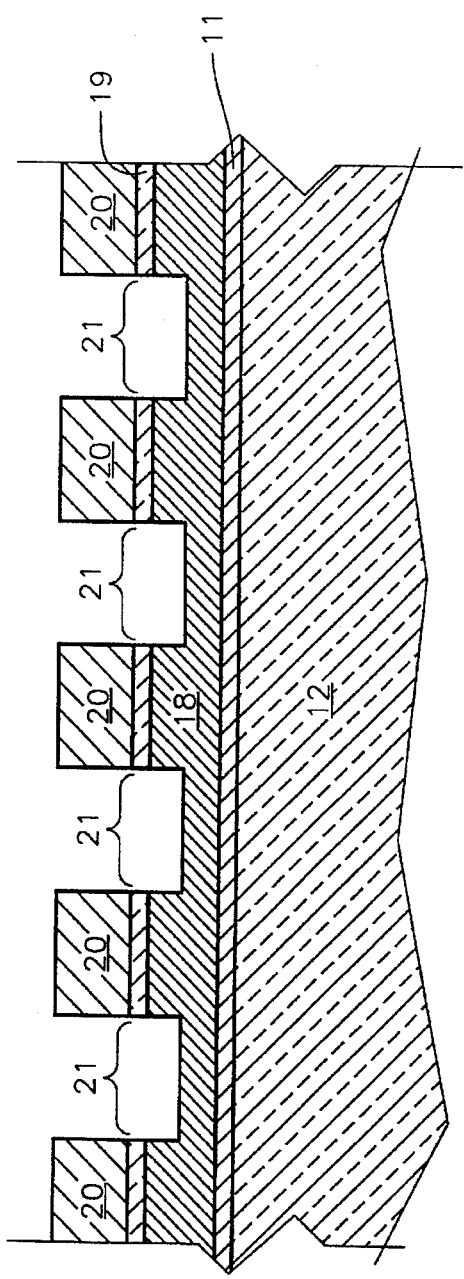
FIG. 2 is a cross-sectional view of the wafer portion of FIG. 1 following the etching of grooves through the capping layer and into the silicate glass layer.

Referring now to FIG. 2, following the formation of a photoresist pattern 20 on top of the fluorine-doped silicate glass layer 18 or on top of the optional silicon dioxide capping layer 19, a predominantly anisotropic etch is performed. This etch, which forms grooves 21, proceeds through the capping layer 19 and into the fluorine-doped glass layer 18, preferably no deeper than the upper surface of the interlevel dielectric layer 12.

Figure 3:
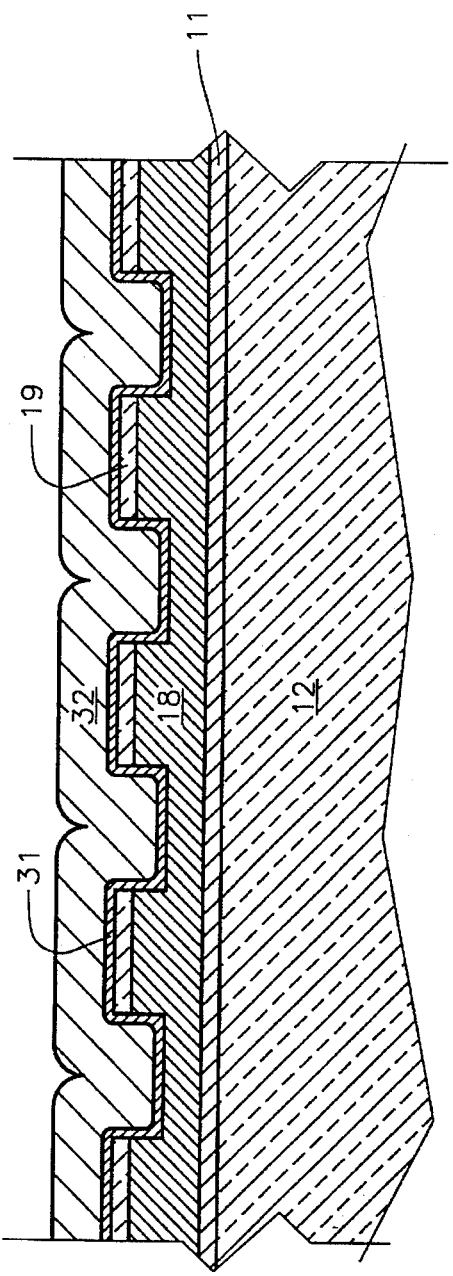
FIG. 3 is a cross-sectional view of the wafer portion of FIG. 2 following removal of the mask and deposition of a conformal upper barrier film.

Referring now to FIG. 3, following removal of the photoresist pattern 20, a conformal silicon nitride upper barrier film 31 is deposited, the upper barrier film 31 completely lining the grooves 21 and covering all exposed surfaces of the optional capping layer 19 and the fluorine-doped glass layer 18. The preferred thickness of the upper barrier film 31 on the sidewalls and floor of each groove 21 is the minimal thickness required for impermeability to migrating fluorine atoms. Subsequently, a conductive layer 32 is deposited, the conductive layer 32 having a thickness sufficient to fill the upper-barrier-layer-lined grooves 21. The conductive layer may be aluminum, an alloy of aluminum, some other metal or metal alloy, or a metal silicide that is compatible with integrated circuit fabrication on a semiconductor substrate.

Referring now to FIG. 4, a portion of conductive layer 32 that is not within the physical confines of the grooves 21 is removed using chemical mechanical polishing step, resist coat and etchback, or a comparable step. A series of parallel conductor strips 41 is thus formed within the upper-barrier-layer-lined trenches 21. It will be noted that each conductor strip has vertical sidewalls and a crown that is parallel to the upper surface of the interlevel dielectric layer.

Referring now to FIG. 5, a bi-level metal structure may be fabricated by repeating the process begun with FIG. 1. A secondary lower barrier film 11A, which corresponds to the lower barrier film 11 of FIG. 1 begins the repeated process. A secondary fluorine-doped silicate glass layer 18A corresponds to fluorine-doped silicate glass layer 18 of FIG. 1; a secondary optional capping layer 19A corresponds to the capping layer 19 of FIG. 1; a secondary upper barrier film 31A corresponds to upper barrier film 31 of FIG. 3; and a secondary series of conductor strips 41A corresponds to the conductor strips 41 of FIG. 4.

A second embodiment of the process used to fabricate the structure which exemplifies the second embodiment invention is described with reference to FIGS. 6 through 9. The second embodiment of the process is deemed to be the preferred embodiment, as only two barrier films are required to seal all portions of the fluorine-doped silicon dioxide layer from underlying layers, the conductive strips and upperlying layers. The first embodiment of the process, on the other hand requires three barrier films to accomplish a similar result. Referring now to FIG. 6, a conductive layer 61 is deposited on top of an interlevel dielectric layer 12, masked with a photoresist mask pattern 62. Like conductive layer 32, it may be aluminum, an alloy of aluminum, some other metal or metal alloy, or a metal silicide that is compatible with integrated circuit fabrication on a semiconductor substrate.

Referring now to FIG. 7, the conductive layer 61 is etched, preferably using a predominantly anisotropic plasma etch to form a series of conductor strips 71 on the surface of the interlevel dielectric layer 18. Each conductor strip 71 has vertical sidewalls and a crown parallel to the upper surface of the interlevel dielectric layer 18. Although a wet etch may replace the plasma etch, conductor sidewall profile will suffer, and a certain amount of critical dimension loss will be inevitable.

Referring now to FIG. 8, a lower barrier film 81 is deposited such that the conductor strips 71 and the exposed surfaces of the interlevel dielectric layer 12 between the conductor strips 71 are completely covered. Although silicon nitride is deemed to be the preferred material for the lower barrier film 81, other materials such as aluminum nitride which are both impermeable to migrating fluorine ions and compatible with the other materials utilized in integrated circuits may be substituted for silicon nitride. A fluorine-doped silicate glass layer 82 is then deposited so that it completely fills the gaps between the barrier-layer-wrapped conductor strips 71. An upper silicon nitride upper barrier film 83 (also referred to herein as the capping barrier layer) is then deposited to prevent fluorine atoms from escaping from the fluorine doped glass layer 82. Other materials, such as aluminum nitride, may be used for the upper barrier film 83.

Referring now to FIG. 9, a bi-level metal structure may be fabricated by repeating the second embodiment of the process which commenced with FIG. 6. A secondary series of conductor strips 71A corresponds to the conductor strips 71 of FIG. 7; a secondary lower barrier film 81A corresponds to the lower barrier film 81 of FIG. 8; a secondary fluorine-doped silicate glass layer 82A corresponds to fluorine-doped silicate glass layer 82 of FIG. 8; and a secondary upper barrier film 83A corresponds to the upper barrier film 83.

The structure formed by either first or second embodiment processes employs silicate glass that is heavily doped with fluorine atoms as the primary dielectric material. The primary dielectric material is encased in a silicon nitride film which has a high degree of impermeability to both fluorine atoms and water molecules. Although silicon nitride possesses a dielectric constant that is higher than undoped silicate glass, the thickness of the silicon nitride film is relatively insignificant compared to the thickness of the fluorine-doped silicate glass portion of the structure. As the dielectric layers are in a serial relationship with one another and the thickness of the silicon nitride layer is relatively insignificant compared with that of the fluorine-doped glass layer, the dielectric constant of the fluorine-doped glass layer dominates in the calculation of the composite dielectric constant.

Although only two embodiments of the process and the structure are disclosed herein, those having ordinary skill in the art of integrated circuit manufacture will realize that changes and modifications may be made to both the processes and the structures without departing from the spirit and the scope of the invention as hereinafter claimed. For example, the first and second embodiments of the process may be combined to create a bi-level metal structure in any order.

I claim:

1. An integrated circuit structure comprising:
   (a) a pair of spaced apart adjacent conductor strips;
   (b) a fluorine-doped silicon dioxide dielectric interposed between said pair of adjacent conductor strips; and
   (c) a barrier film interposed between said fluorine-doped dielectric and each of said conductor strips.

2. The integrated circuit structure of claim 1, wherein said barrier film prevents diffusion of fluorine atoms from the dielectric to either of the conductor strips.

3. The integrated circuit structure of claim 1, wherein said barrier film further seals the fluorine-doped dielectric from water molecules in the atmosphere.

4. The integrated circuit structure of claim 1, wherein each of said conductor strips is formed from an aluminum alloy.

5. The integrated circuit structure of claim 1, wherein each of said conductor strips is formed from a copper alloy.

6. The integrated circuit structure of claim 1, wherein said fluorine-doped dielectric is completely encased by at least one barrier film.

7. The integrated circuit structure of claim 1, wherein each of said conductor strips is completely encased by at least one barrier film.

8. The integrated circuit structure of claim 1, wherein said barrier film comprises a material selected from the group consisting of silicon nitride and aluminum nitride.

9. The integrated circuit structure of claim 1, which further comprises an identical integrated circuit structure superjacent thereto.

10. An integrated circuit structure comprising:
    (a) a semiconductor substrate;
    (b) an interlevel dielectric layer superjacent the substrate, said interlevel dielectric layer having an upper surface;
    (c) a plurality of spaced-apart parallel conductor strips positioned longitudinally parallel to said upper surface, each conductor strip having an adjacent pair relationship with at least one other conductor strip and with no more than two other conductor strips;
    (d) a fluorine-doped silicon dioxide dielectric interposed between the conductor strips of each pair;
    (e) a barrier film interposed between each conductor strip and each adjacent fluorine-doped dielectric, said film preventing diffusion of fluorine atoms from the dielectric to an adjacent conductor strip.

11. The integrated circuit structure of claim 10, wherein said barrier film also functions as a barrier to water molecules.

12. The integrated circuit structure of claim 10, wherein said semiconductor substrate is single crystal silicon and said interlevel dielectric layer comprises silicon dioxide.

13. The integrated circuit structure of claim 10, wherein said semiconductor substrate is single crystal silicon and said interlevel dielectric layer comprises boron and phosphorus doped silicon dioxide.

14. The integrated circuit structure of claim 10, wherein each of said conductor strips is formed from an aluminum alloy.

15. The integrated circuit structure of claim 10, wherein each of said conductor strips is formed from a copper alloy.

16. The integrated circuit structure of claim 10, wherein said barrier film comprises a material selected from the group consisting of silicon nitride and aluminum nitride.

17. The integrated circuit structure of claim 10, wherein each fluorine-doped dielectric is part of a fluorine-doped glass layer which overlies the upper surface of said interlevel dielectric layer.

18. The integrated circuit structure of claim 10, wherein each conductor strip is located in a trench formed within the fluorine-doped glass layer, each trench having sidewalls and a floor that are coated with the barrier film.

19. The integrated circuit structure of claim 10, wherein each conductor strip is in contact along its length with said upper surface.

20. The integrated circuit structure of claim 10, wherein each fluorine-doped dielectric is part of a fluorine-doped glass layer which overlies each of said conductor strips.

21. The integrated circuit structure of claim 10, which further comprises an identical integrated circuit structure superjacent thereto.

22. An integrated circuit structure comprising:
    (a) a semiconductor substrate;

(b) an interlevel dielectric layer overlying said substrate;

(c) a fluorine-doped glass layer overlying said dielectric layer, said glass layer having an upper surface;

(d) a plurality of parallel trenches formed in said glass layer, each of said trenches having a floor parallel to said upper surface and sidewalls contiguous along an edge with said upper surface;

(e) a barrier film lining the floor and sidewalls of each of said trenches; and (f) a metal conductor strip within each barrier film lined trench.

23. The integrated circuit structure of claim 22, wherein in said sidewalls are perpendicular to said upper surface.

24. The integrated circuit structure of claim 22, wherein each conductor strip is formed from an aluminum alloy.

25. The integrated circuit structure of claim 22, wherein said barrier film comprises a material selected from the group consisting of silicon nitride and aluminum nitride.

26. The integrated circuit structure of claim 22, wherein said semiconductor substrate is single crystal silicon and said interlevel dielectric layer comprises silicon dioxide.

27. The integrated circuit structure of claim 22, which further comprises an identical integrated circuit structure superjacent thereto.

28. An integrated circuit structure comprising:

(a) a semiconductor substrate;

(b) an interlevel dielectric layer overlying said substrate, said dielectric layer having an upper surface;

(c) a plurality of spaced-apart parallel metal conductor strips disposed on said upper surface, each conductor strip having sidewalls perpendicular to said upper surface and a crown parallel to said upper surface, each adjacent pair of conductor strips forming a trough between themselves, each trough having a floor corresponding to a portion of the upper surface;

(d) a barrier film covering the sidewalls of each conductor strip and the floor between each adjacent pair of conductor strips; and (e) a fluorine-doped glass filler strip within each trough.

29. The integrated circuit structure of claim 28, wherein the barrier film also covers the crown of each conductor strip.

30. The integrated circuit structure of claim 28, which further comprises a silicon nitride capping layer overlying the fluorine-doped glass filler strips and the conductor strips.

31. The integrated circuit structure of claim 28, wherein each fluorine-doped glass filler strip is part of a fluorine-doped glass layer which extends above the silicon nitride barrier film covered crown of each conductor line.

32. The integrated circuit structure of claim 31, which further comprises a capping barrier layer overlying the fluorine-doped glass layer.

33. The integrated circuit structure of claim 32, wherein said barrier film and said capping barrier layer comprises a material selected from the group consisting of silicon nitride and aluminum nitride.

34. The integrated circuit structure of claim 28, which further comprises an identical integrated circuit structure superjacent thereto.

* * * * *